(12) United States Patent
Menzel et al.

(10) Patent No.: US 8,573,508 B2
(45) Date of Patent: Nov. 5, 2013

(54) COMPARTMENTALIZATION OF FLUID EJECTOR DEVICE

(75) Inventors: Christoph Menzel, New London, NH (US); Andreas Bibl, Los Altos, CA (US); Paul A. Hoisington, Hanover, NH (US)

(73) Assignee: FUJIFILM Corporation, Tokyo (JP)

( * ) Notice: Subject to any disclaimer, the term of this patent is extended or adjusted under 35 U.S.C. 154(b) by 864 days.

(21) Appl. No.: 12/641,203

(22) Filed: Dec. 17, 2009

(65) Prior Publication Data

US 2011/0147483 A1 Jun. 23, 2011

(51) Int. Cl.
*B05B 1/08* (2006.01)
*B23P 17/00* (2006.01)
*B41J 2/045* (2006.01)

(52) U.S. Cl.
USPC ............. 239/102.2; 29/890.1; 347/68

(58) Field of Classification Search
None
See application file for complete search history.

(56) References Cited

U.S. PATENT DOCUMENTS 6,270,193 B1 * 8/2001 Hiwada ............... 347/50
2005/0285909 A1 * 12/2005 Murata et al. ........... 347/70
2010/0220146 A1 9/2010 Menzel et al.

FOREIGN PATENT DOCUMENTS

WO 2009/143354 11/2009

* cited by examiner

*Primary Examiner* — Lisa M Solomon
(74) *Attorney, Agent, or Firm* — Fish & Richardson P.C.

(57) ABSTRACT

A fluid ejection apparatus includes a substrate having a plurality of fluid passages for fluid flow and a plurality of nozzles fluidically connected to the fluid passages, a plurality of actuators positioned on top of the substrate to cause fluid in the plurality of fluid passages to be ejected from the plurality of nozzles, a housing component with a descending portion that projects down to the substrate, an integrated circuit chip supported on the substrate, a potting barrier secured to the housing component and positioned between the integrated circuit chip and the actuators, and a potting material between the integrated circuit chip and the barrier.

16 Claims, 10 Drawing Sheets

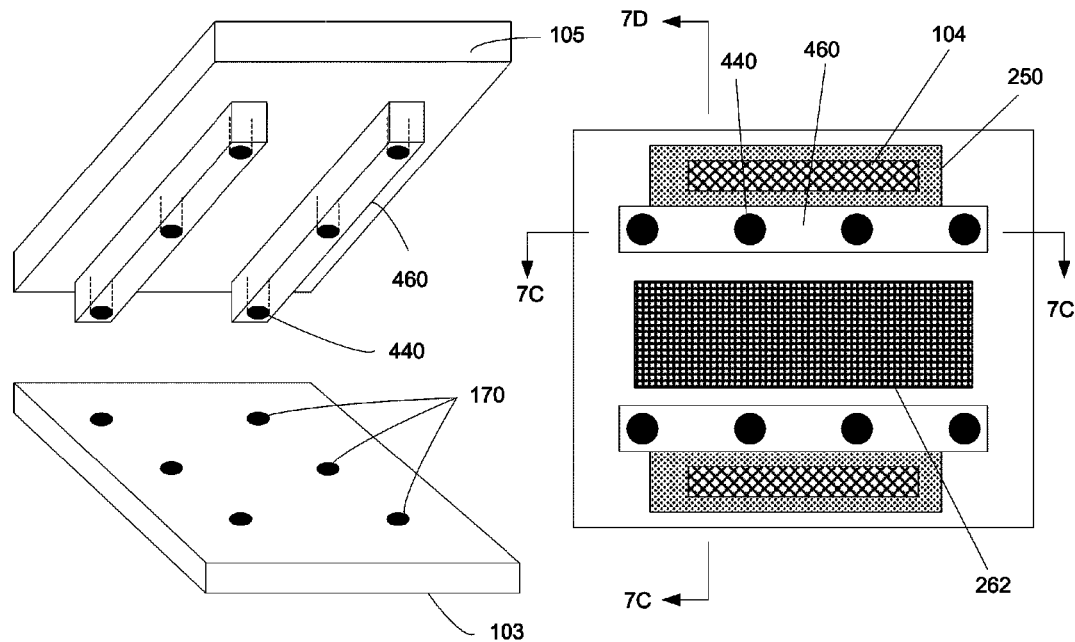
FIG. 7A    FIG. 7B
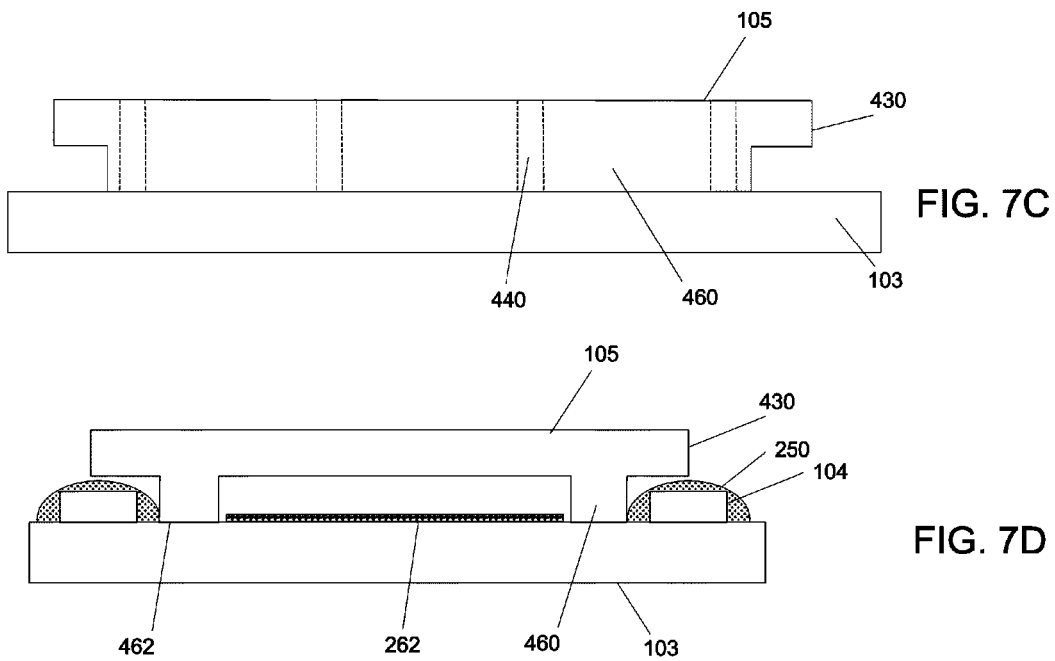
FIG. 7C
FIG. 7D

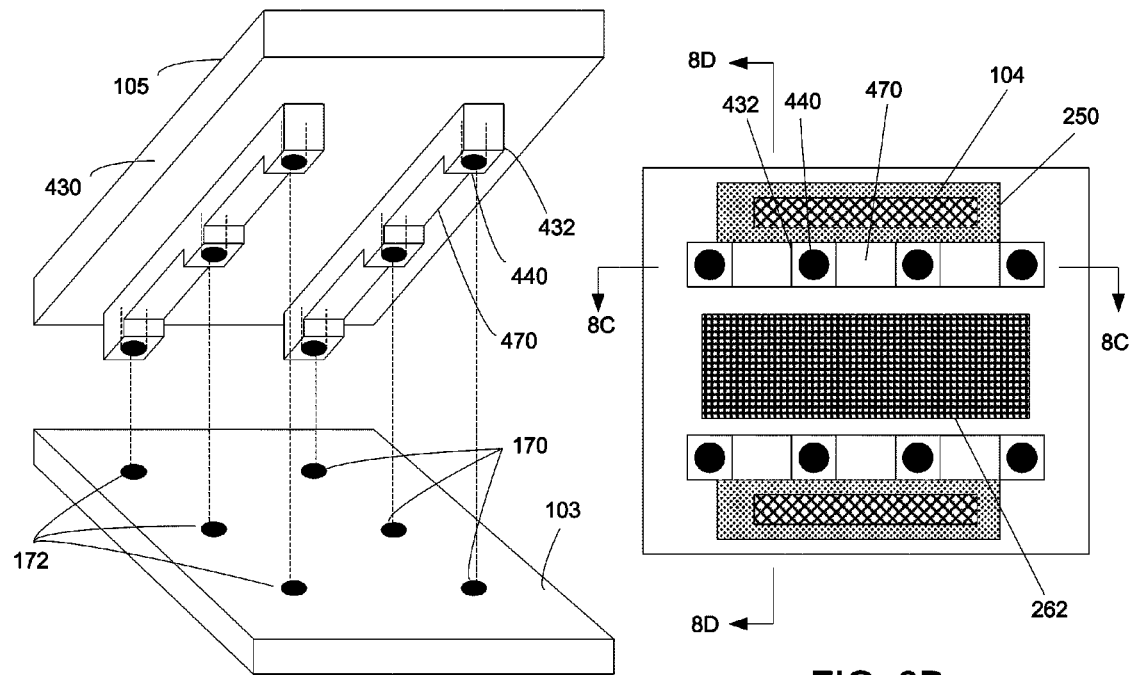
FIG. 8A
FIG. 8B
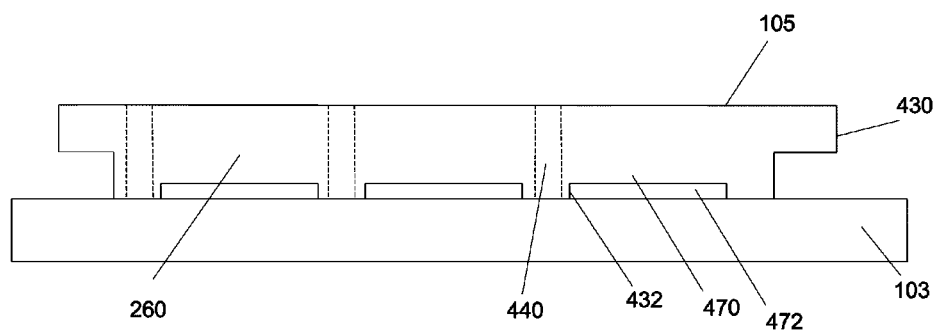
FIG. 8C
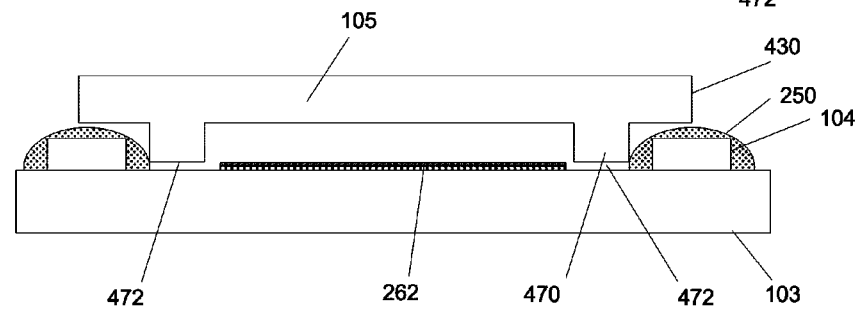
FIG. 8D

COMPARTMENTALIZATION OF FLUID EJECTOR DEVICE

TECHNICAL FIELD

The present disclosure relates generally to fluid droplet ejection.

BACKGROUND

In some implementations of a fluid droplet ejection device, a substrate, such as a silicon substrate, includes a fluid pumping chamber, a descender, and a nozzle formed therein. Fluid droplets can be ejected from the nozzle onto a medium, such as in a printing operation. The nozzle is fluidically connected to the descender, which is fluidically connected to the fluid pumping chamber. The fluid pumping chamber can be actuated by a transducer, such as a thermal or piezoelectric actuator, to eject a fluid droplet from the nozzle. The medium can be moved relative to the fluid ejection device, and the ejection of a fluid droplet from a nozzle can be timed with the movement of the medium to place a fluid droplet at a desired location on the medium. Fluid ejection devices typically include multiple nozzles, and it is usually desirable to eject fluid droplets of uniform size and speed, and in the same direction, to provide uniform deposition of fluid droplets on the medium.

SUMMARY

In general, in one aspect, a fluid ejection apparatus includes a substrate having a plurality of fluid passages for fluid flow and a plurality of nozzles fluidically connected to the fluid passages, a plurality of actuators positioned on top of the substrate to cause fluid in the plurality of fluid passages to be ejected from the plurality of nozzles, a housing component with a descending portion that projects down to the substrate, an integrated circuit chip supported on the substrate, a barrier secured to the housing component and positioned between the integrated circuit chip and the actuators, and potting material between the integrated circuit chip and the barrier.

This and other implementations can optionally include one or more of the following features. The actuators may be piezoelectric actuators. The housing component may be an interposer. The potting barrier may be part of the housing component. The housing component and potting barrier may be silicon. The housing component may include a plurality of descending portions and the barrier may include a portion of the housing component that spans a gap between adjacent descending portions. A bottom of the portion may be coplanar with a bottom of the descending portion of the housing component. The barrier may include a wall extending downwardly from the housing component, and there may be a gap between a bottom of the barrier and the substrate. The potting barrier may be a sealing compound adhered to the housing component. The housing component may include a plurality of descending portions and the sealing compound may span a gap between adjacent descending portions. The potting barrier may be joined to the descending portion of the housing component. The housing component may include a plurality of descending portions and the barrier may span a gap between adjacent descending portions. The bottom of the barrier may be coplanar with the bottom of the descending portion of the housing component. The descending portion of the housing component may project past the potting barrier. A plurality of protective layers may be formed over at least a portion of the plurality of actuators. An absorbent layer may be inside the housing component.

In another aspect, a method of forming a potting barrier secured to a housing component and positioned between a integrated circuit chip and an actuators includes leaving the material un-etched between the pipe features during the making of the housing component.

In another aspect, a method of forming a potting barrier secured to a housing component and positioned between a integrated circuit chip and an actuators includes connecting the potting barrier to the descending portion of the housing component.

In another aspect, a method of forming a potting barrier secured to a housing component and positioned between a integrated circuit chip and an actuators includes applying a sealing compound to the edge of the gaps between the descending portion of the housing component and the substrate, and allowing the surface tension to distribute the sealing compound into the gaps.

Potential advantages include the following. A physical barrier can protect the piezoelectric actuators from moisture, thereby improving lifetime. A physical barrier can block or impede the flow of potting compound from the region where the IC chip is attached to the substrate to the piezoelectric actuator region, thereby reducing the likelihood that the piezoelectric actuators will be contaminated and increasing manufacturing yield.

The details of one or more embodiments are set forth in the accompanying drawings and the description below. Other features, aspects, and advantages will become apparent from the description, the drawings, and the claims.

BRIEF DESCRIPTION OF THE DRAWINGS

FIG. 7A is an exploded perspective view of another implementation of an interposer and a substrate from a fluid ejector.

FIG. 7B is a schematic top view of substrate when used with the interposer of FIG. 7A.

FIGS. 7C and 7D are schematic cross-sectional views of FIG. 7A along lines 7C-7C and 7D-7D, respectively.

FIG. 8A is an exploded perspective view of yet another implementation of an interposer and a substrate from a fluid ejector.

FIG. 8B is a schematic top view of substrate when used with the interposer of FIG. 8A.

FIGS. 8C and 8D are schematic cross-sectional views of FIG. 8A along lines 8C-8C and 8D-8D, respectively.

Like reference numbers and designations in the various drawings indicate like elements.

DETAILED DESCRIPTION

Figure 1:
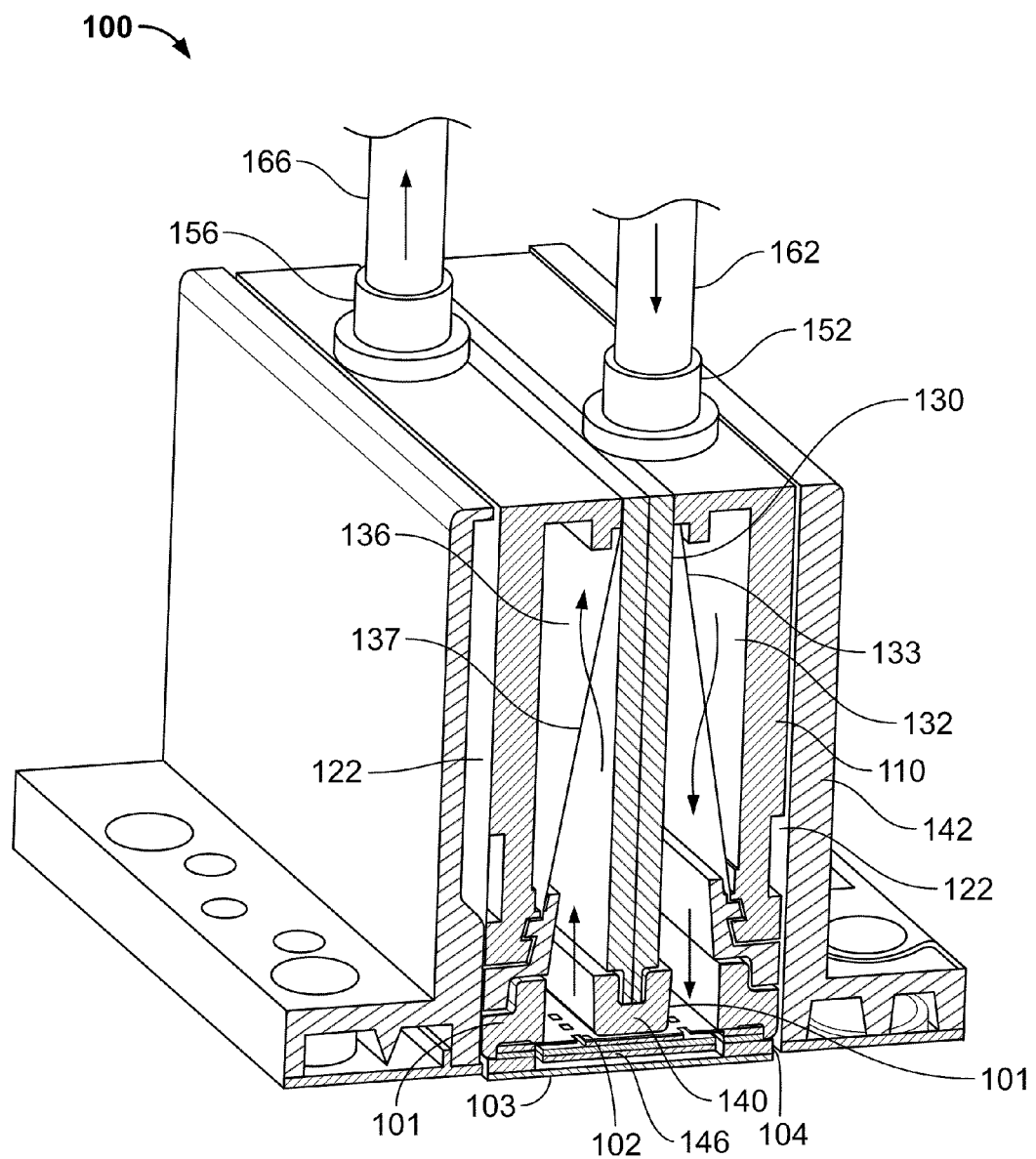
FIG. 1 is a perspective view of an example fluid ejector.

One problem with fluid droplet ejection from a fluid ejector is that moisture, e.g., from the liquid being ejected, can intrude into the electrical or actuating components, such as an electrode or piezoelectric material of a piezoelectric actuator or an integrated circuit element driving the piezoelectric actuator. Moisture can cause failure of the fluid ejector due to electrical shorting between electrodes or degradation of the piezoelectric material, and can reduce the lifetime of the fluid ejector.

One strategy is to coat the actuator region with a protective layer, e.g., a polymer, dielectric or metal layer. However, the diffusion rate of moisture through the protective layer can still be too high to use thin layers of these materials, and thick layers could hinder the deflection of the membrane and impair functioning of the actuator. Another strategy is to use a desiccant in or connected to a chamber containing the piezoelectric actuators. However, given the limited space available, placement of the desiccant may be mechanically difficult.

Potting of electronics is a process of covering or encapsulating an electronic component, e.g., by filling a chamber in which the component is located, with a solid compound to provide resistance to shock and vibration and to exclude moisture and corrosive agents. Thermosetting plastics are often used for potting. However, the thick layers of potting material that are usable with electronics can cause functional issues if a portion is applied to a piezoelectric actuator because the extra material can impede the actuation of the piezoelectric actuator. In some MEMS scale devices that place integrated circuit (IC) chips, such as ASICS, onto the same substrate that supports the piezoelectric actuators, these IC chips and piezoelectric actuators can be so close together that it can be very difficult to pot the IC chips appropriately without contaminating the piezoelectric actuators.

In order to allow reliable potting of the IC chips without contaminating the piezoelectric actuators, often it is possible to put a physical barrier is placed between these structures that will block or impede the flow of potting compound from the region where the IC chip is attached to the substrate to the piezoelectric actuator region.

In some instances, there can be problems in placing a barrier in physical contact with both structures. For example, physical contact of the barrier with electrical interconnects can cause problems, e.g., defects in the electrical connection between the IC chips and the actuators. In addition, if the electrical interconnects have some relief above the substrate, then fitting the physical barrier to both the top of the interconnects and the region between the interconnects involves significant processing complexity. Hence, one option is to provide a physical barrier which leaves a small gap just above the interconnects, and subsequently backfill the gap with a potting material that has wetting characteristics selected to permit the potting materials to be drawn under the barrier, into the gap and thereby seal the gap.

Referring to FIG. 1, an implementation of a fluid ejector 100 includes a fluid ejection module, e.g., a quadrilateral plate-shaped printhead module, which can be a die fabricated using semiconductor processing techniques. The fluid ejection module includes a substrate 103 in which a plurality of fluid paths 124 (see FIGS. 2A, 2B) are formed, and a plurality of actuators to individually control ejection of fluid from nozzles of the flow paths.

The fluid ejector 100 can also include an inner housing 110 and an outer housing 142 to support the printhead module, a mounting frame 199 to connect the inner housing 110 and outer housing 142 to a print bar, and a flexible circuit, or flex circuit 201 (see FIG. 2A) and associated printed circuit board 155 (see FIG. 4C) to receive data from an external processor and provide drive signals to the die. The outer housing 142 can be attached to the inner housing 110 such that a cavity 122 is created between the two. The inner housing 110 can be divided by a dividing wall 130 to provide an inlet chamber 132 and an outlet chamber 136. Each chamber 132 and 136 can include a filter 133 and 137. Tubing 162 and 166 that carries the fluid can be connected to the chambers 132 and 136, respectively, through apertures 152, 156. The dividing wall 130 can be held by a support 144 that sits on an interposer assembly 146 above the substrate 103. The inner housing 110 can further include a die cap 107 configured to seal a cavity 901 (see FIG. 2A) in the fluid ejector 100 and to provide a bonding area for components of the fluid ejector that are used in conjunction with the substrate 103. The fluid ejector 100 further includes fluid inlets 101 and fluid outlets 102 for allowing fluid to circulate from the inlet chamber 132, through the substrate 103, and into the outlet chamber 136.

Figure 2A:
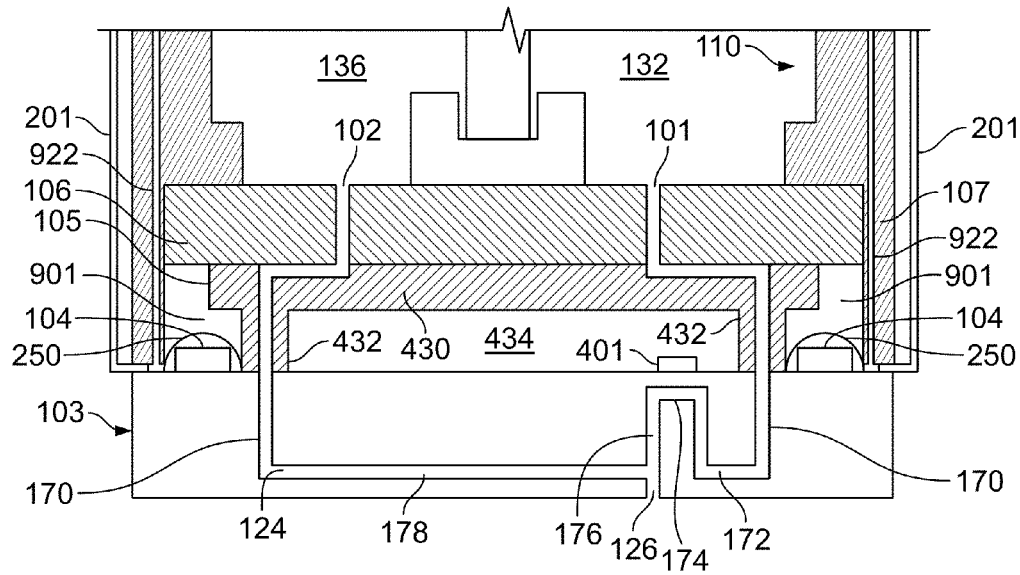
FIG. 2A is a cross-sectional schematic of a portion of an example fluid ejector.

Referring to FIG. 2A, the substrate 103 can include fluid flow paths 124 that end in nozzles 126 (only one flow path is shown in FIG. 2A). A single fluid path 124 includes a fluid feed 170, an ascender 172, a pumping chamber 174, and a descender 176 that ends in the nozzle 126. The fluid path can further include a recirculation path 178 so that ink can flow through the ink flow path 124 an out of a fluid return 179 even when fluid is not being ejected.

Figure 2B:
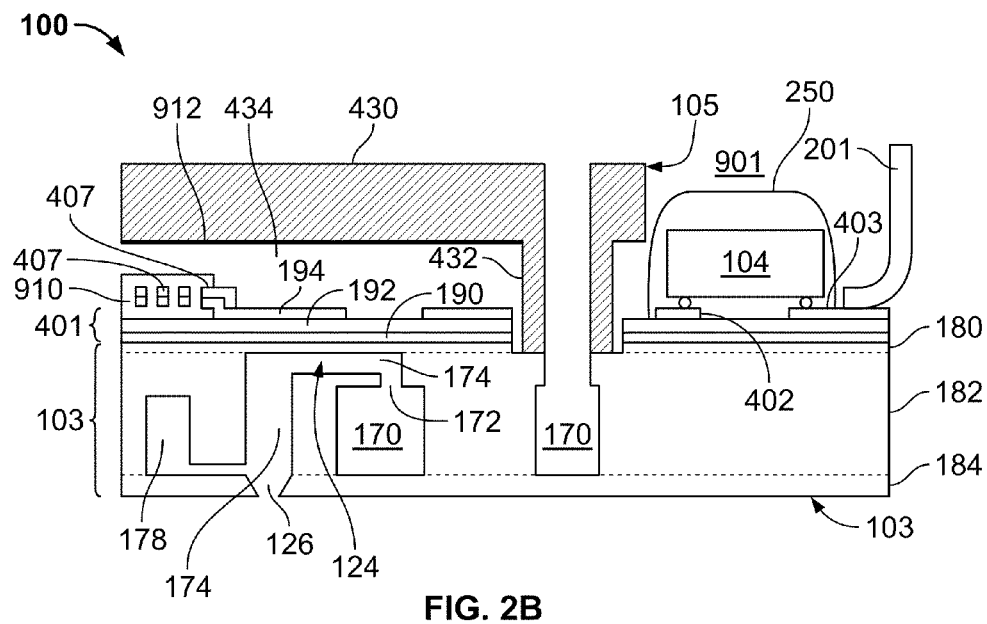
FIG. 2B is a cross-sectional close-up view of a portion of a fluid ejector.
Figure 2C:
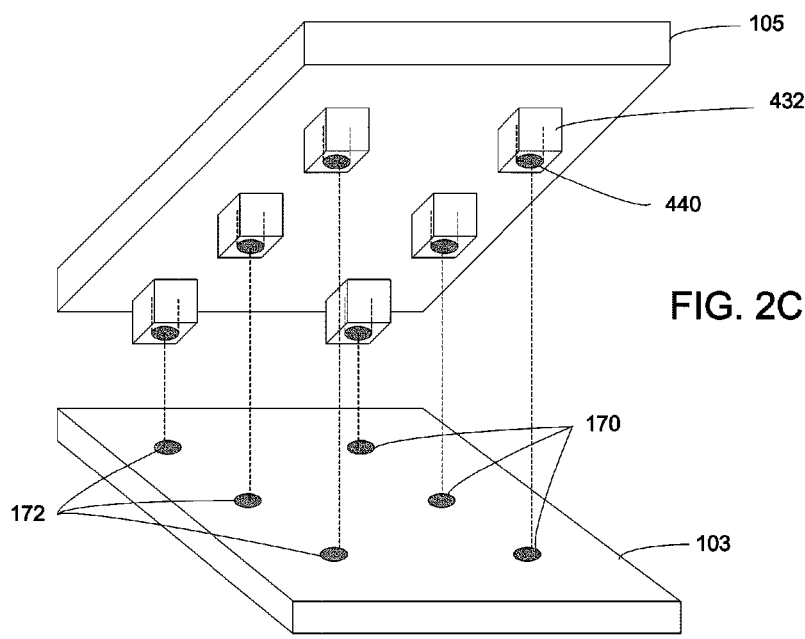
FIG. 2C is an exploded perspective view of an interposer and a substrate from a fluid ejector.
Figure 2D:
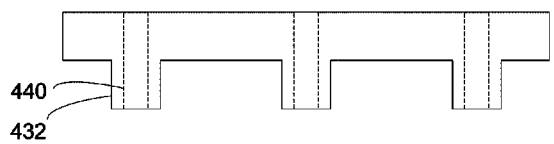
FIGS. 2D and 2E are side and front views, respectively, of an interposer.
Figure 2E:
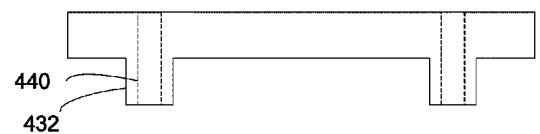

Shown in FIG. 2B, the substrate 103 can include a flow-path body 182 in which the flow path 124 is formed by semiconductor processing techniques, e.g., etching. Substrate 103 can further include a membrane 180, such as a layer of silicon, which seals one side of the pumping chamber 174, and a nozzle layer 184 through which the nozzle 126 is formed. The membrane 180, flow path body 182 and nozzle layer 184 can each be composed of a semiconductor material (e.g., single crystal silicon).

Referring to FIGS. 2A and 2B, the fluid ejector 100 can also include individually controllable actuators 401 supported on the substrate 103 for causing fluid to be selectively ejected from the nozzles 126 of corresponding fluid paths 124 (only one actuator 401 is shown in FIGS. 2A, 2B). In some implementations, activation of the actuator 401 causes the membrane 180 to deflect into the pumping chamber 174, forcing fluid through the descender 174 and out of the nozzle 126. For example, the actuator 401 can be a piezoelectric actuator, and can include a lower conductive layer 190, a piezoelectric layer 192, e.g., formed of lead zirconate titanate (PZT), and a patterned upper conductive layer 194. The piezoelectric layer 192 can be between e.g. about 1 and 25 microns thick, e.g., about 2 to 4 microns thick. Alternatively, the actuator 401 can be a thermal actuator. Each actuator 401 has several corresponding electrical components, including an input pad and one or more conductive traces 407 to carry a drive signal. Although not shown in FIG. 2B, the actuators 401 can be disposed in columns in a region between the inlets

101 and outlets 102. Each flow path 124 with its associated actuator 401 provides an individually controllable MEMS fluid ejector unit.

Figure 3:
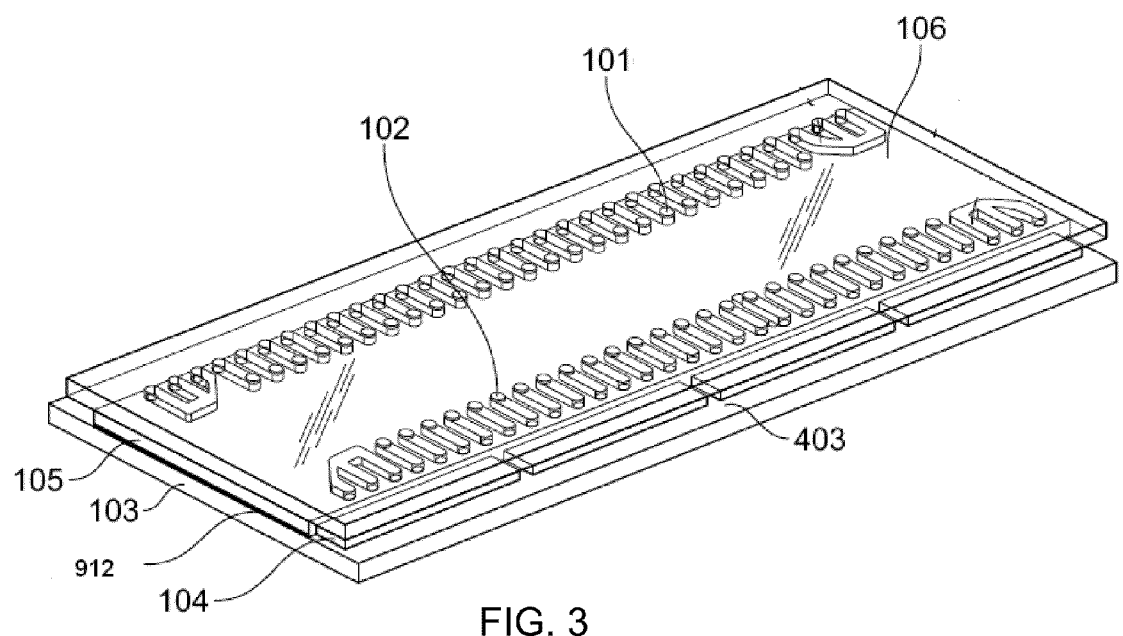
FIG. 3 is a schematic semi-transparent perspective view of an example substrate with an upper and lower interposer.

Referring to FIGS. 2B and 3, the fluid ejector 100 further includes one or more integrated circuit elements 104 configured to provide electrical signals, e.g., on the conductive traces 407, to control actuators 401. The integrated circuit element 104 can be a separate microchip, other than the substrate 103, in which integrated circuits are formed, e.g., by semiconductor fabrication and packaging techniques. For example, the integrated circuit elements 104 can be application-specific integrated circuit (ASIC) elements. Each integrated circuit element 104 can include corresponding electrical components, such as the input pad 402, output trace 403, transistors, and other pads and traces. The integrated circuit elements 104 can be mounted directly onto the substrate 103 in a row extending parallel to the inlets 101 or outlets 102.

Referring to FIGS. 2A and 2B, in some implementations, a potting material 250 can be located in the cavity 901. The potting materials 250 covers and encapsulates the integrated circuit element 104 to protect it from vibration and moisture. The potting material can be adhered to a portion of the upper surface of the substrate 103 around the integrated circuit element 104, but does not extend into the cavity 434 in which the actuators 401 are located. The potting material can be a thermosetting plastic, e.g., Hysol CB064 from Henkel Technologies, or an epoxy, silicone or polyurethane.

Referring to FIGS. 2A, 2B, and 3, in some implementations, the inner housing 110 includes a lower interposer 105 to separate the fluid from the electrical components actuators 401 and/or the integrated circuit elements 104. As shown in FIG. 2A, the lower interposer 105 can include a main body 430 and flanges 432 that project down from the main body 430 to contact the substrate 103 in a region between the integrated circuit elements 104 and the actuators 401. The flanges 432 hold the main body 430 over the substrate to form an actuator cavity 434. This prevents the main body 430 from contacting and interfering with motion of the actuators 401. Although not shown, the cavity 434 with the actuators can be connected to the cavity 901 with the ASICs 104. For example, flanges 432 can extend only around fluid feed channels 170, e.g. in a donut shape, such that cavities 434 and 901 form one cavity, and air can pass between adjacent flanges.

Referring to FIGS. 2B-2E, in some implementations, the main body 430 of the lower interposer 105 is a generally planar upper plate, and the flanges 432 are projections, e.g., rectangular or cylindrical projections, that extend downwardly and perpendicularly from the lower face the main body 430. The projections 432 can be about 25 to 200 μm high, e.g., 50 μm high, so that the chamber 434 has a similar height above the substrate 103. Passages 440 extend vertically through the projections 432, and each projection can be positioned such that when the lower interposer 105 is attached to substrate 103, passages 440 mate with associated fluid feeds 170 or fluid returns 179 to fluidically connect the fluid feeds 170 and fluid returns 179 to the inlets 101 and outlets 102.

The interposer 105 can be a unitary body of homogenous material, e.g., silicon, e.g., single crystal silicon, with the projections 432 and passages 440 formed by etching, e.g., deep reactive ion etching.

In some implementations (shown in FIG. 2B), an aperture is formed through the membrane layer 180, as well as the layers of the actuator 401 if present, so that the flange 432 directly contacts the flow-path body 182. Alternatively, the flange 432 could contact the membrane 180 or another layer that covers the substrate 103. The fluid ejector 100 can further include an upper interposer 106 to further separate the fluid from the actuators 401 or integrated circuit elements 104.

In some embodiments, the lower interposer 105 directly contacts, with or without a bonding layer therebetween, the substrate 103, and the upper interposer 106 directly contacts, with or without a bonding layer therebetween, the lower interposer 105. Thus, the lower interposer 105 is sandwiched between the substrate 103 and the upper interposer 106, while maintaining the cavity 434. The flex circuits 201 (see FIG. 2A) are bonded to a periphery of the substrate 103 on a top surface of the substrate 103. The die cap 107 can be bonded to a portion of the upper interposer 106, creating the cavity 901. Although the die cap 107 is illustrated as contacting the top surface of the upper flex circuit 201, in practice there can be a small gap, e.g., about a 20 micron gap, between the die cap 107 and the flex circuit 201. The flex circuit 201 can bend around the bottom of the die cap 107 and extend along an exterior of the die cap 107. The integrated circuit elements 104 are bonded to an upper surface of the substrate 103, closer to a central axis of the substrate 103, such as a central axis that runs a length of the substrate 103, than the flex circuits 201, but closer to a perimeter of the substrate 103 than the lower interposer 105. In some embodiments, the side surfaces of the lower interposer 105 are adjacent to the integrated circuit element 104 and extend perpendicular to a top surface of the substrate 103.

In some embodiments, one or more protective layers are disposed on the fluid ejector module to reduce permeation of moisture to vulnerable components, such as the conductive traces, electrodes, or piezoelectric portions. The protective layer (or at least one of the protective layers if multiple protective layers are present) has an intrinsic permeability to moisture less than that of SU-8, i.e., less than $2.5 \times 10^{-3}$ g/m·day, e.g., less than about $1 \times 10^{-3}$ g/m·day. The protective layer can have an intrinsic permeability multiple orders of magnitude less than SU-8, e.g., less than about $2.5 \times 10^{-6}$ g/m·day. For example, the intrinsic permeability can be less than about $2.5 \times 10^{-7}$ g/m·day, e.g., less than about $1 \times 10^{-7}$ g/m·day, e.g., less than about $2.5 \times 10^{-8}$ g/m·day. In particular, the protective layer can be sufficiently impermeable that even where the protective layer is sufficiently thin that it does not interfere with operation of the actuator, it will still provide the device with a useful lifetime of more than a year, e.g., three years.

In some embodiments, this protective layer is disposed directly on the plurality of actuators, whereas in some other embodiments, the protective layer is an outer protective layer and a dielectric inner protective layer is disposed between the plurality of actuators and the outer protective layer. It may be noted that the upper conductive layer 194 is considered part of the actuators; as a layer that needs to be protected from moisture, it is not part of the protective layer structure. The protective layer can be the outermost layer, e.g., exposed to the environment in the cavity 434, or the protective layer can be a penultimate layer to the cavity, e.g., the protective layer can be covered by an insulator or a non-wetting coating.

Figure 2F:
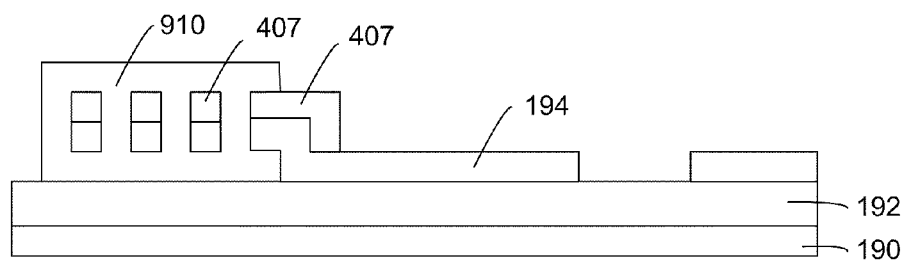
FIGS. 2F and 2G are cross-sectional close-up views of a portion of another implementation of a fluid ejector with a polymer layer.

In some embodiments, shown in FIG. 2F, a protective layer 910 is deposited on the fluid ejector module. This protective layer 910 can contact the traces 407, electrodes 194 and/or piezoelectric layer 192. The protective layer 910 is a dielectric material. In some implementations, the protective layer 910 is a polymer, e.g., a polyimide, an epoxy and/or a photoresist, such as a layer of SU-8. In some implementations, the protective layer 910 is an inorganic material with an intrinsic permeability to moisture less than that of SU-8, e.g., an oxide, nitride or oxynitride, such as silicon dioxide.

The protective layer is formed over the traces 407 of actuators 401 in order to protect the electrical components from fluid or moisture in the fluid ejector. The protective layer can be absent from the region above the pumping chamber 174 in order to avoid interference with the actuation of the membrane 180 over the pumping chamber.

Although FIGS. 2F-2I illustrate a protective layer 910 that consists of a single layer, in any of these embodiments this structure can be replaced with multiple dielectric protective layers, e.g., a protective layer stack with multiple dielectric layers. The protective layer stack can include a combination of layers with at least some layers of different materials, such as an oxide layer between two polymer layers.

Figure 2G:
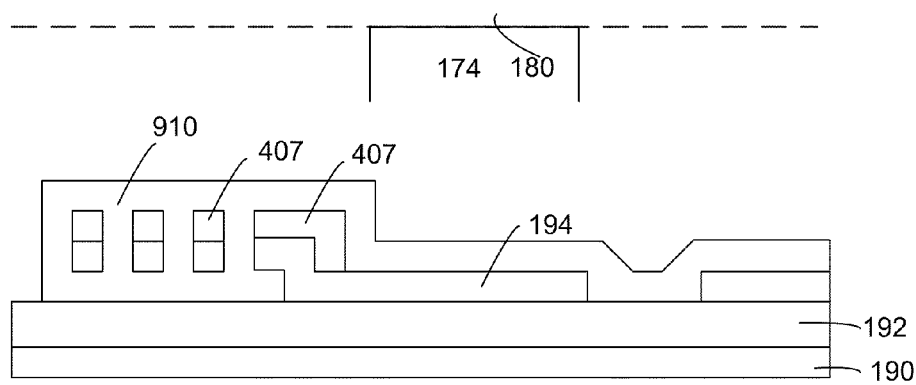

Alternatively, as shown in FIG. 2G, if the protective layer is sufficiently thin or flexible that the actuator 401 (see FIG. 2B) can function properly, the protective layer 910 can be formed over the traces 407 and the actuators 401, including over the pumping chamber 174. In this case, the protective layer can still be removed in regions, e.g., surrounding the inlets and outlets of the fluid path in the substrate, where the interposer projects down to contact the substrate 103. In some implementations, the protective layer 910 is a contiguous layer covering the top surface of the substrate, e.g., covering all of the actuators and spanning the gaps between the actuators as well. In this context, a contiguous layer could have apertures, but is connected throughout in an unbroken unitary manner.

The protective layer 910 can have a thickness greater than 0.5 microns, e.g., a thickness of about 0.5 to 3 microns, e.g., if the protective layer is oxide, nitride or oxynitride, or 3 to 5 microns, e.g., if the protective layer is a polymer, e.g., SU-8. If multiple layers are present, then the total thickness can be about 5 to 8 microns. If an oxide layer is used, the oxide layer can have a thickness of about 1 micron or less. The protective layer structure can be deposited by spin coating, spray coating, sputtering, or plasma enhanced vapor deposition.

Alternatively or in addition, the protective layer 910 can include a non-wetting coating, such as a molecular aggregation, formed over the traces 407 and/or the actuators 401. That is, the non-wetting coating can be formed in place of, or over, another protective polymer layer, such as a photoresist layer.

Figure 2H:
FIGS. 2H and 2I are cross-sectional close-up views of a portion of another implementation of a fluid ejector with a polymer layer that is coated with a thin film.
Figure 2I:
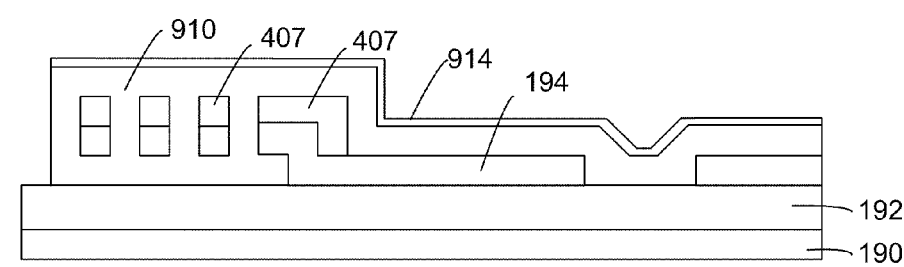

In some embodiments, shown in FIG. 2H, the protective layer 910 (or protective layer stack) extends over the pumping chambers, e.g., over the traces 407 and the actuators 401, and is coated with another protective layer, a thin film 914 that further protects the actuator from moisture. In some embodiments, the location of the thin film 914 is generally the same as the protective layer 910. For example, the thin film can be continuous to cover the entire region within the chamber 434, including the traces 407. In other embodiments, as shown in FIG. 2I, the thin film 914 is patterned to be generally aligned with and only overlay the pumping chambers 174 and actuators 401 but not the traces 407. In general, the thin film cover at least the regions where voltage is applied to the piezoelectric material, e.g., over the pumping chambers.

Similar to the protective layer 910, the thin film 914 can be a contiguous layer covering all of the actuators and spanning the gaps between the actuators as well. At least in the region over the actuators, the thin film 914 can be the outermost layer on the substrate, e.g., it can be exposed to the environment in the chamber 434.

In any of these embodiments, apertures in the protective layer 910 and thin film 914 can be formed in regions where contacts to the conductive layers 190 and 194 are needed, e.g., at bond pads at the ends of traces 407 where the ASIC 104 is attached, although such apertures would not be located over the pumping chamber 174. In embodiments including both the thin film 914 and the optional non-wetting coating, the non-wetting coating will be disposed over the thin film 914, i.e., the thin film 914 is between the protective layer 910 and the non-wetting coating.

The film 914 can be formed of a material that has a lower intrinsic permeability for moisture than polymer materials, e.g., the polymer material in the protective layer 910, and does not significantly mechanically load or constrain the actuator. The film 914 can provide the protective layer that has an intrinsic permeability to moisture less than that of SU-8, e.g., with an intrinsic permeability in the ranges discussed above, e.g., less than about $2.5 \times 10^{-7}$ g/m·day. In some implementations, the thin film 914 is formed of a material that has a lower intrinsic permeability for moisture than the underlying protective layer 910. In some implementations, the thin film 914 can have a lower extensive permeability, and thus lower diffusion rate, than that of the protective layer 910.

The thin film 914 can be mechanically stiffer than the underlying protective layer 910. If the protective layer 910 is more flexible than the thin film, the protective layer 910 can partially mechanically de-couple the thin film 914 from the piezoelectric layer 192.

Examples of the material of the thin moisture-protective film include metals, oxides, nitrides, or oxynitrides. The film 914 should be as thin as possible, while still being sufficiently thick to maintain sufficient step coverage and be sufficiently pin hole free to provide satisfactory permeability.

In some implementations, the thin film 914 is a metal, e.g., a conductive metal. If the thin film 914 is conductive, the dielectric protective layer 910 can provide electrical insulation between the top thin film 914 and the actuators 401.

Examples of metals that can be used for the thin film 914 include aluminum, gold, NiCr, TiW, platinum, iridium, or a combination thereof, although other metals may be possible. The film can include an adhesion layer (e.g., TiW, Ti, or Cr). The metal film is generally not less than 10 nm in thickness, but is still very thin, for example, not greater than 300 nm. In some implementations, the film 914 can be between 200-300 nm thick. If the adhesion layer is present, it can have a thickness of 20 nm or less. In some implementations, the film 914 is not greater than 100 nm thick, e.g., not greater than 50 nm. The metal film may be grounded to provide additional benefits beyond moisture protection, such as EMI shielding. The metal layer can be deposited by sputtering.

Some examples of oxide, nitride, and oxynitride materials that can provide the thin moisture-protective film are alumina, silicon oxide, silicon nitride, and silicon oxynitride. These films are generally not greater than 500 nm in thickness. The oxide, nitride or oxynitride layer can be deposited by plasma-enhanced chemical vapor deposition. In general, a metal film is advantageous in that it can be made very thin while still providing very low permeability to moisture. Without being limited to any particular theory, this may be because a metal layer can be deposited by sputtering with low pinhole density. While a pinhole free film, whether metal or non-metal, is advantageous for superior impermeability to moisture, it is not required. Good moisture protection can be achieved if the size of the holes ($r_h$) is much smaller than the thickness of the polymer layer ($t_p$), i.e., $r_h \ll t_p$, and the area density of the holes is very low, i.e., Hole Area<<Total Area. As exemplary values, the ratio of $t_p$:$r_h$ can be 100:1 or more, and the ratio of Total Area:Hole Area can be 10,000:1 or more.

Applying a thin film of metal, oxide, nitride or oxynitride to the polymer layer can create a protective barrier against fluid or moisture for the actuators of the fluid ejection apparatus. As one theory, not meant to be limiting, this better protection against fluid or moisture may be due to the substantially lower diffusion rates of fluid or moisture through the thin film materials compared to the diffusion rates through the polymer materials.

Further, as shown in FIGS. 2B and 3, a moisture-absorbent layer 912 can be located inside the cavity 434. Alternatively, or in addition, the absorbent layer 912 can be located inside the cavity 901. The absorbent layer 912 can be more absorptive than the protective layer 910. The absorbent layer can be made of, for example, a desiccant. The desiccant can be, for example, silica gel, calcium sulfate, calcium chloride, montmorillonite clay, molecular sieves, zeolite, alumina, calcium bromide, lithium chloride, alkaline earth oxide, potassium carbonate, copper sulfate, zinc chloride, or zinc bromide. The desiccant can be mixed with another material, such as an adhesive, to form the absorbent layer 912, e.g. the absorbent can be STAYDRAY™ HiCap2000. Alternatively, an absorbent material such as paper, plastics (e.g. nylon6, nylon66, or cellulose acetate), organic materials (e.g. starch or polyimide such as Kapton® polyimide), or a combination of absorbent materials (e.g. laminate paper) can be placed in the cavity 122. The absorbent layer can also be made of other absorptive materials, such as paper, plastics (e.g. nylon6, nylon66, or cellulose acetate), organic materials (e.g. starch or polyamide), or a combination of absorbent materials (e.g. laminate paper). The absorbent layer 912 can be less than 10 microns, for example between 2 and 8 microns, thick to avoid interference with the proper functioning of the actuators 401. Further, the absorbent layer 912 can span most or all of the length and width of the cavity 434 in order to increase surface area and total absorbency. The absorbent layer 912 can be attached to, e.g., deposited on, a bottom surface of the interposer 104.

Figure 4A:
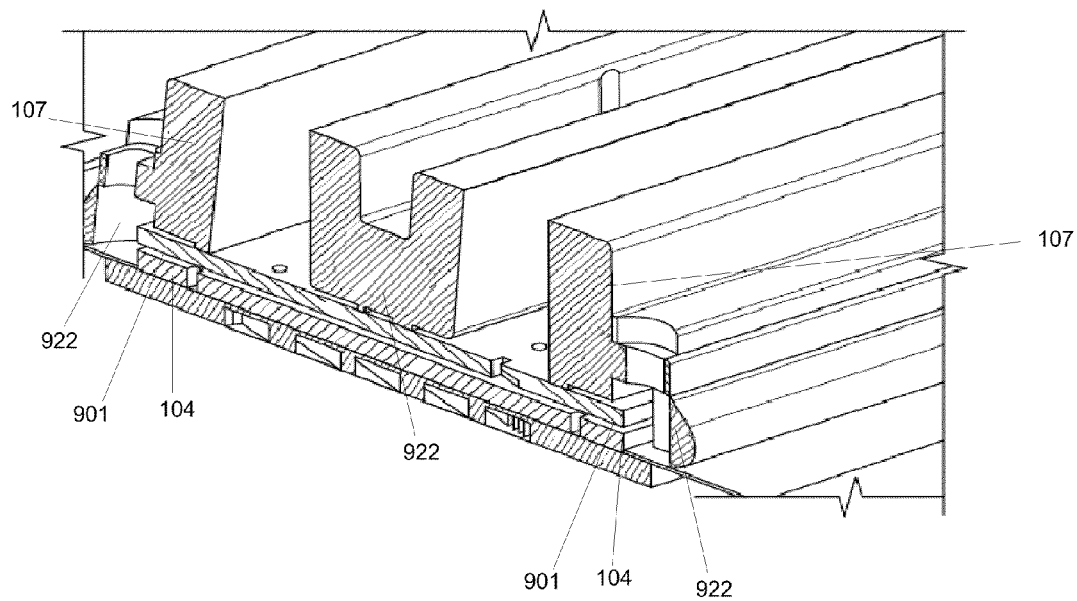
FIGS. 4A, 4B, and 4C are perspective views of a portion of an example fluid ejector having a passage in a housing.
Figure 4B:
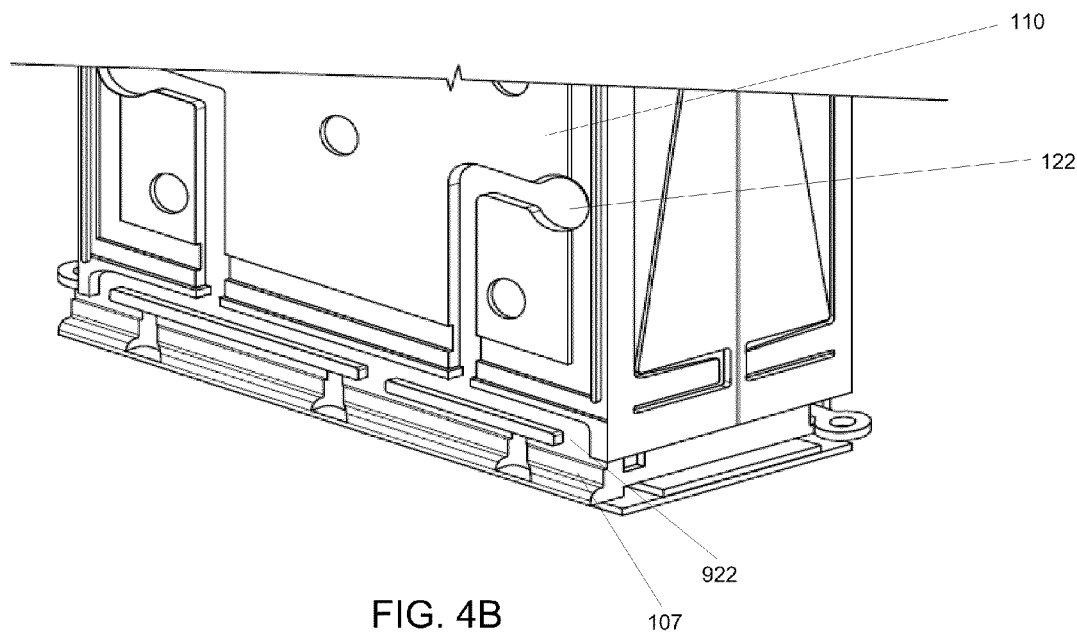
Figure 4C:
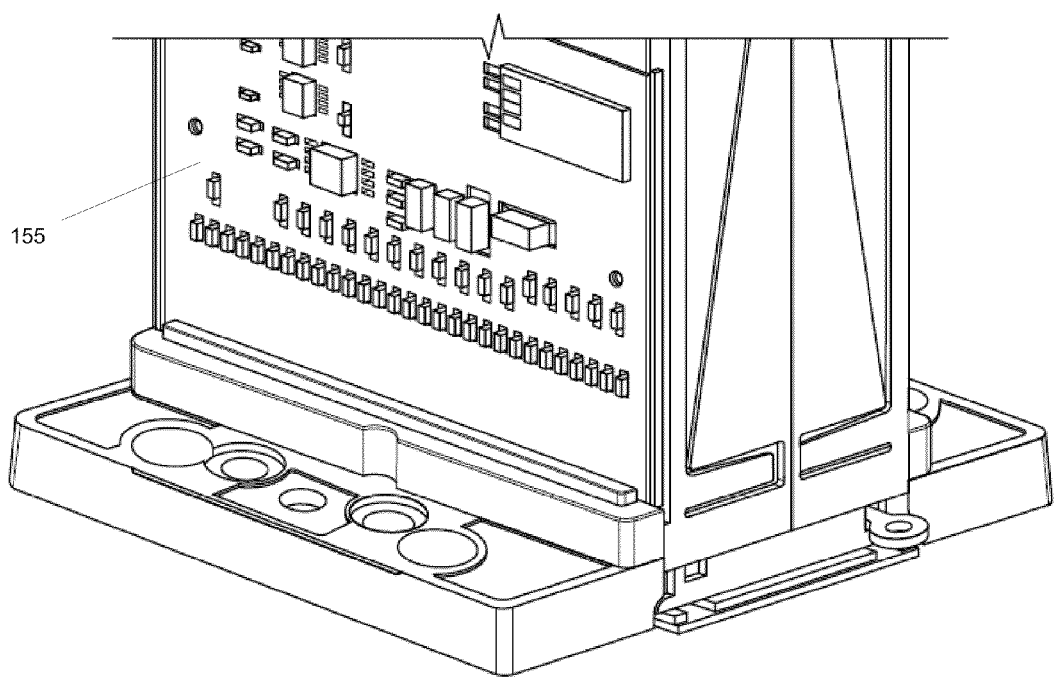

In some implementations, shown in FIGS. 2A and 4A-5, a channel or passage 922 is formed through the die cap 107 and inner housing 110 to allow moisture to be removed from the integrated circuit elements 104 and/or actuators 401. As shown in FIG. 4A, the passage 922 can start at the cavity 901 above the integrated circuit elements 104 (which can be connected to the cavity 434, as discussed above) and can extend upwards through the die cap 107. The die cap 107 can be made of a stiffened plastic material, such as liquid crystal polymer ("LCP"), in order to stabilize the passage 922. Shown in FIG. 4B, the passage 922 can then extend through the inner housing 110 or form a groove on the surface of the inner housing 110. Further, as shown in FIG. 4C, the passage 922 can extend through the printed circuit board 155 and the flex circuit 201 (see FIG. 2A).

Figure 5:
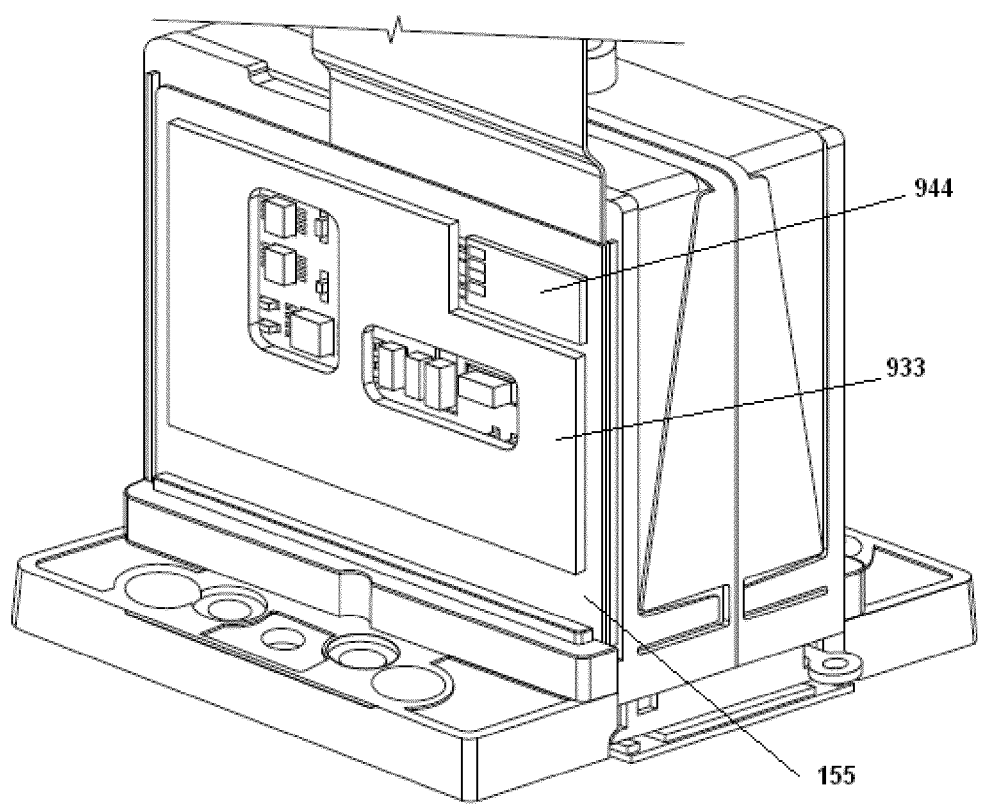
FIG. 5 is a perspective view of a portion of an example fluid ejector having an absorbent material attached to a flex circuit.

In some implementations, the passage 922 can end at a chamber or cavity 122 between the inner housing 110 and outer housing 142 (see FIG. 1). The cavity 122 can include an absorbent material, such as a desiccant. The desiccant can be, for example, silica gel, calcium sulfate, calcium chloride, montmorillonite clay, molecular sieves, zeolite, alumina, calcium bromide, lithium chloride, alkaline earth oxide, potassium carbonate, copper sulfate, zinc chloride, or zinc bromide. The desiccant can be mixed with another material, such as an adhesive, to form the absorbent, e.g. the absorbent can be STAYDRAY™ HiCap2000. Alternatively, an absorbent material such as paper, plastics (e.g. nylon6, nylon66, or cellulose acetate), organic materials (e.g. starch or polyimide such as Kapton® polyimide), or a combination of absorbent materials (e.g. laminate paper) can be placed in the cavity 122. The absorbent material 933 can be attached, for example, to the flex circuit 201 or the printed circuit board 155, as shown in FIG. 5. In other implementations, the passage 922 can lead to the atmosphere, such as through a hole in cavity 122 (see FIG. 1).

In some implementations, the passage 922 can be connected to a pump, such as a vacuum pump, which can be activated by a humidity sensor, such as humidity sensor 944. The humidity sensor can be, for example, a bulk resistance-type humidity sensor that detects humidity based upon a change of a thin-film polymer due to vapor absorption. Thus, for example, if the humidity inside the cavity 901 and/or the cavity 434 rises above, e.g., 80-90%, the pump can be activated to remove moisture from the cavity 901. Such activation can avoid condensing humidity levels in the cavity 901 and/or the cavity 434.

During fluid droplet ejection, moisture from fluid being circulated through the ejector can intrude into the piezoelectric actuator or the integrated circuit elements, which can cause failure of the fluid ejector due to electrical shorting. By including an absorbent layer inside the cavity near the actuators or integrated circuit elements, the level of moisture in the cavity can be reduced, as absorbents, e.g. desiccants, can absorb up to 1,000 more times moisture than air.

Further, by having a passage in the inner housing that leads from a cavity containing the actuators and integrated circuit elements through the housing, the air volume surrounding the actuators and integrated circuit elements (e.g. from the cavities 901 and 434) can be increased up to 100 times. For example, the air volume can be increased 75 times, e.g. from 0.073 cc to 5.5 cc. Increasing the air volume can in turn increase the time that it takes for the air to become saturated, which can decrease the rate of moisture interfering with electrical components in the actuators or integrated circuit elements. By further adding an absorbent material, such as a desiccant, to a chamber at the end of the passage, the moisture can be further vented away from the electrical components. Such steps to avoid moisture can increase the lifetime of the fluid ejector.

In some implementations, a physical barrier is placed between the integrated circuit chip region and the actuator region of the substrate to block or impede the flow of potting material that is used to pot the integrated circuit chip. This feature can be combined with the features of the various implementations discussed above.

Figure 6A:
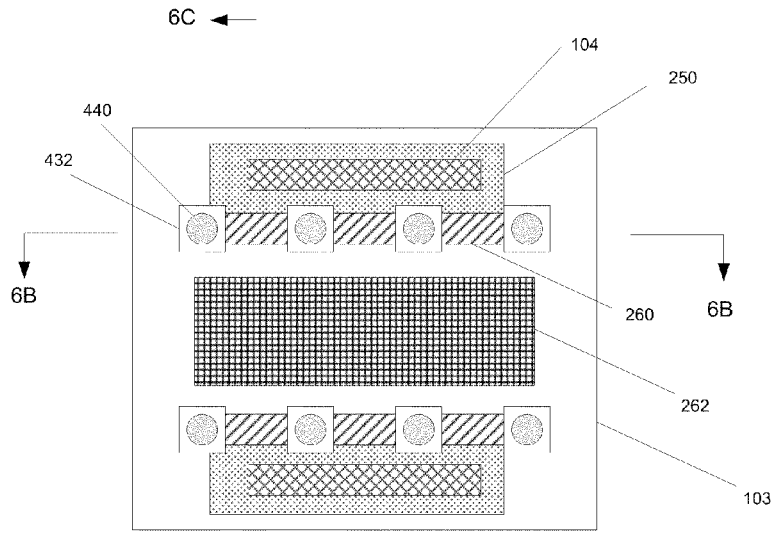
FIG. 6A is a schematic top view of substrate illustrating a region with an underfill material in gaps between projections from the interposer.
Figure 6B:
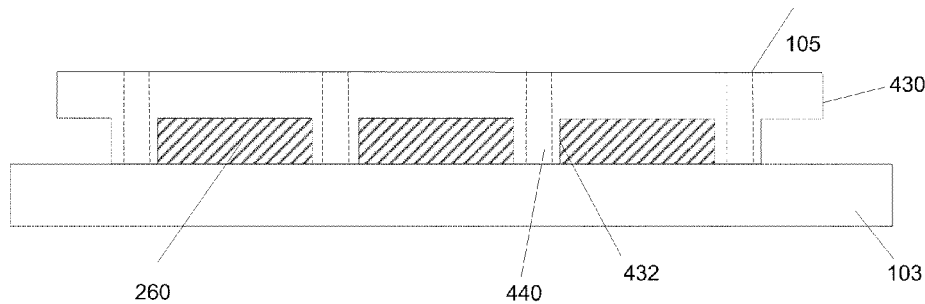
FIGS. 6B and 6C are schematic cross-sectional views of FIG. 6A along lines 6B-6B and 6C-6C, respectively.
Figure 6C:
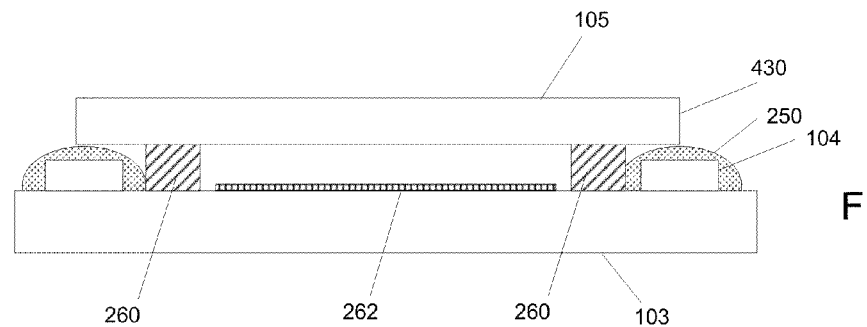

In some implementations, shown in FIGS. 6A-6C, the barrier may be a sealing compound 260 adhered to the housing component, e.g., the lower interposer 105, and/or the substrate 103. For example, a low surface tension sealing material may be applied at the gaps between the descending portions of the housing component, e.g., gaps between the projections 432 of the lower interposer 105, and the substrate 103. The sealing compound may flow into the gaps by capillary action or surface tension. The sealing compound can be a thermosetting plastic, an epoxy, silicone or polyurethane. Once the sealing compound is in place, it can be solidified by applying heat. Then the potting material 250 can be deposited over the integrated circuit elements 104, and the sealing compound 260 prevents the potting material 250 from flowing over the actuator region 262 on the substrate 103. Alternatively, this barrier could be one or more solid bodies, e.g., of plastic or metal, adhesively attached to the housing component.

In other implementations, shown in FIGS. 7A-8D, the barrier is part of the housing component itself, e.g., part of the lower interposer 105. During the manufacturing process that forms the projections 432, some material is left that forms a barrier (e.g., wall or web) between the interposers the projections 432. Thus, the barrier can be a unitary part of and having the same composition as the housing component.

In particular, as shown in FIGS. 7A-7D, in some implementations, there are one or more walls 460 of uniform height (i.e., the bottom of the wall is a planar surface). The bottom of this barrier can extend down far enough that it forms part of the bond that holds the interposer to the die so that the bottom of the barrier is coplanar with the bottom of the descending portion of the housing component. Thus, in some implementations, the bottom surface 462 of the wall 460 abuts the substrate 103, in a continuous line extending between the integrated circuit elements 104 and the actuator region 262 on the substrate 103. The wall 460 can be joined, e.g., adhesively secured, to the substrate 130 along some or all of the length of the wall 460. Multiple vertical passages 440 can be formed in the wall, and the passages can be positioned such that when the lower interposer 105 is attached to substrate 103, passages 440 mate with associated fluid feeds 170 or fluid returns 179 to fluidically connect the fluid feeds 170 and fluid returns 179 to the inlets 101 and outlets 102. The implementations shown in FIGS. 7A-7D show the barrier having a uniform width, but the wall 460 could be wider in the regions around the passages 440.

Due to the electrical interconnect traces that run between the ink ports on the substrate, this region may not be sufficiently planar to allow a precision bond of a rigid barrier. In this case, the barrier may extend from the housing component towards, but not touch, the substrate 103. For example, as shown in FIGS. 8A-8D, in some implementations, the barrier is an integral portion of the interposer, and the barrier may be formed by one or more walls 470 extending downwardly from the main body 430 of the lower interposer 105. The projections 434 still project down to contact the substrate 103, but the height of the walls 470 can be slightly less than the height of the projections 434, and the walls 470 can be positioned to span one or more gaps between adjacent projections 434. For example, the walls may leave a gap 472 of about 0.5 to 100 microns between the bottom surface of the wall 470 and the substrate 103. This gap 472 can be too narrow to allow the viscous potting material to flow through. The implementations shown in FIGS. 8A-8D show the barrier having the same width as the projection 434, but the wall 470 could be narrower than the projections 434.

The implementations shown in FIGS. 6A-8D show the barrier extending between and aligned with the passages 440. However, the barriers could be placed in other locations that do not connect to the projections or surround the passages. In such a case, however, the barrier would still be positioned along an extended area between the integrated circuit chip region and the actuator region of the substrate.

Implementations of the barrier can be combined with other moisture protection implementations described above, including the protective layer and/or desiccant.

The use of terminology such as "front," "back," "top," "bottom," "above," and "below" throughout the specification and claims is to illustrate relative positions or orientations of the components. The use of such terminology does not imply a particular orientation of the ejector relative to gravity.

Particular embodiments have been described. Other embodiments are within the scope of the following claims.

What is claimed is:

1. A fluid ejection apparatus comprising:
a substrate having a plurality of fluid passages for fluid flow and a plurality of nozzles fluidically connected to the fluid passages;
a plurality of actuators positioned on top of the substrate to cause fluid in the plurality of fluid passages to be ejected from the plurality of nozzles;
a housing component with a descending portion that projects down to the substrate;
an integrated circuit chip supported on the substrate;
a potting barrier secured to the housing component and positioned between the integrated circuit chip and the actuators; and
a potting material between the integrated circuit chip and the barrier.

2. The fluid ejection apparatus of claim 1, wherein the actuators are piezoelectric actuators.

3. The fluid ejection apparatus of claim 1, wherein the housing component is an interposer.

4. The fluid ejection apparatus of claim 1, wherein the potting barrier is part of the housing component.

5. The fluid ejection apparatus of claim 4, wherein the housing component and potting barrier are silicon.

6. The fluid ejection apparatus of claim 4, wherein the housing component includes a plurality of descending portions and the barrier comprises a portion of the housing component that spans a gap between adjacent descending portions.

7. The fluid ejection apparatus of claim 6, wherein a bottom of the portion is coplanar with a bottom of the descending portion of the housing component.

8. The fluid ejection apparatus of claim 6, wherein the barrier comprises a wall extending downwardly from the housing component, and there is a gap between a bottom of the barrier and the substrate.

9. The fluid ejection apparatus of claim 1, wherein the potting barrier is a sealing compound adhered to the housing component.

10. The fluid ejection apparatus of claim 9, wherein the housing component includes a plurality of descending portions and the sealing compound spans a gap between adjacent descending portions.

11. The fluid ejection apparatus of claim 1, wherein the potting barrier is joined to the descending portion of the housing component.

12. The fluid ejection apparatus of claim 1, wherein the housing component includes a plurality of descending portions and the barrier spans a gap between adjacent descending portions.

13. The fluid ejection apparatus of claim 1, wherein a bottom of the barrier is coplanar with a bottom of the descending portion of the housing component.

14. The fluid ejection apparatus of claim 1, wherein the descending portion of the housing component projects past the potting barrier.

15. The fluid ejection apparatus of claim 1, further comprising a plurality of protective layers formed over at least a portion of the plurality of actuators.

16. The fluid ejection apparatus of claim 1, further comprising an absorbent layer inside the housing component.

* * * * *